(12) United States Patent
Huang et al.

(10) Patent No.: US 11,355,639 B1
(45) Date of Patent: Jun. 7, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Shou-Wan Huang, Hsinchu (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/140,157

(22) Filed: Jan. 4, 2021

(30) Foreign Application Priority Data

Dec. 4, 2020 (CN) .......................... 202011411105.8

(51) Int. Cl.
| | | |
|---|---|---|
| H01L 29/78 | (2006.01) | |
| H01L 27/06 | (2006.01) | |
| H01L 27/088 | (2006.01) | |
| H01L 29/66 | (2006.01) | |
| H01L 29/06 | (2006.01) | |

(52) U.S. Cl.
CPC ........ *H01L 29/785* (2013.01); *H01L 27/0688* (2013.01); *H01L 27/0886* (2013.01); *H01L 29/0649* (2013.01); *H01L 29/66795* (2013.01)

(58) Field of Classification Search
CPC ... H01L 27/06; H01L 27/068; H01L 27/0688; H01L 27/08; H01L 27/088; H01L 27/0886; H01L 29/06; H01L 29/064; H01L 29/0649; H01L 29/068; H01L 29/0688; H01L 29/78; H01L 29/785
USPC .......................................................... 257/365
See application file for complete search history.

(56) References Cited

U.S. PATENT DOCUMENTS

| | | |
|---|---|---|
| 9,865,704 B2 | 1/2018 | Xie et al. |
| 10,622,479 B1 | 4/2020 | Yang |
| 2020/0058652 A1 * | 2/2020 | Park ................ H01L 21/823821 |

* cited by examiner

*Primary Examiner* — Monica D Harrison
(74) *Attorney, Agent, or Firm* — Winston Hsu

(57) ABSTRACT

A method for fabricating semiconductor device includes the steps of: providing a substrate having a first region and a second region; forming a first fin-shaped structure on the first region; removing part of the first fin-shaped structure to form a first trench; forming a dielectric layer in the first trench to form a double diffusion break (DDB) structure; and forming a first gate structure and a second gate structure on the DDB structure. Preferably, a bottom surface of the first gate structure is lower than a top surface of the first fin-shaped structure.

20 Claims, 7 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region; removing part of the first fin-shaped structure to form a first trench; forming a dielectric layer in the first trench to form a double diffusion break (DDB) structure; and forming a first gate structure and a second gate structure on the DDB structure. Preferably, a bottom surface of the first gate structure is lower than a top surface of the first fin-shaped structure.

According to another aspect of the present invention, a semiconductor device includes: a substrate having a first region and a second region; a first fin-shaped structure on the first region; a first single diffusion break (SDB) structure in the first fin-shaped structure to divide the first fin-shaped structure into a first portion and a second portion; and a first gate structure and a second gate structure on the first SDB structure. Preferably, a bottom surface of the first gate structure is lower than a top surface of the first fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
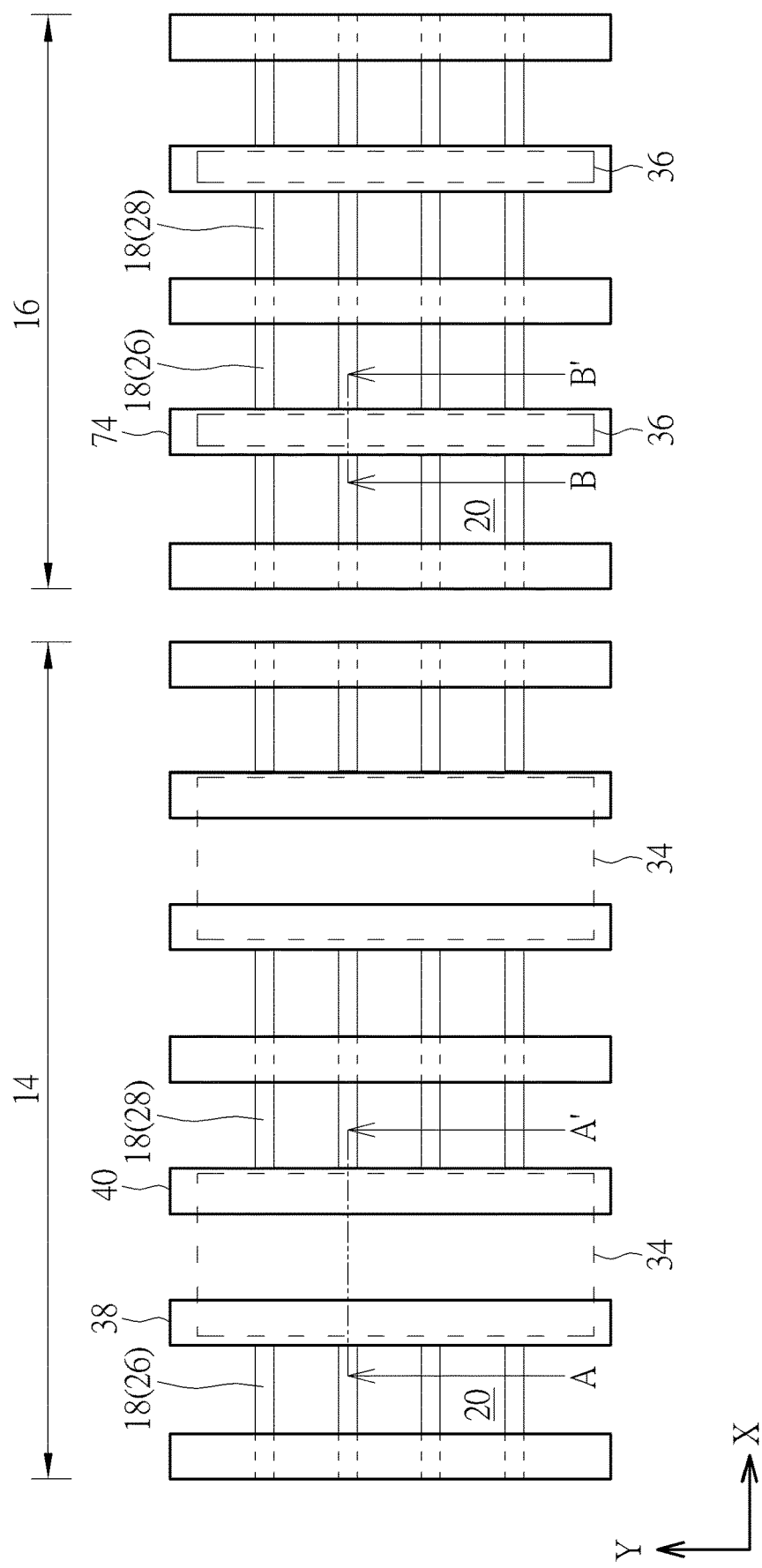
FIG. 1 is a top view illustrating a method for fabricating a semiconductor device according to an embodiment of the present invention.
Figure 2:
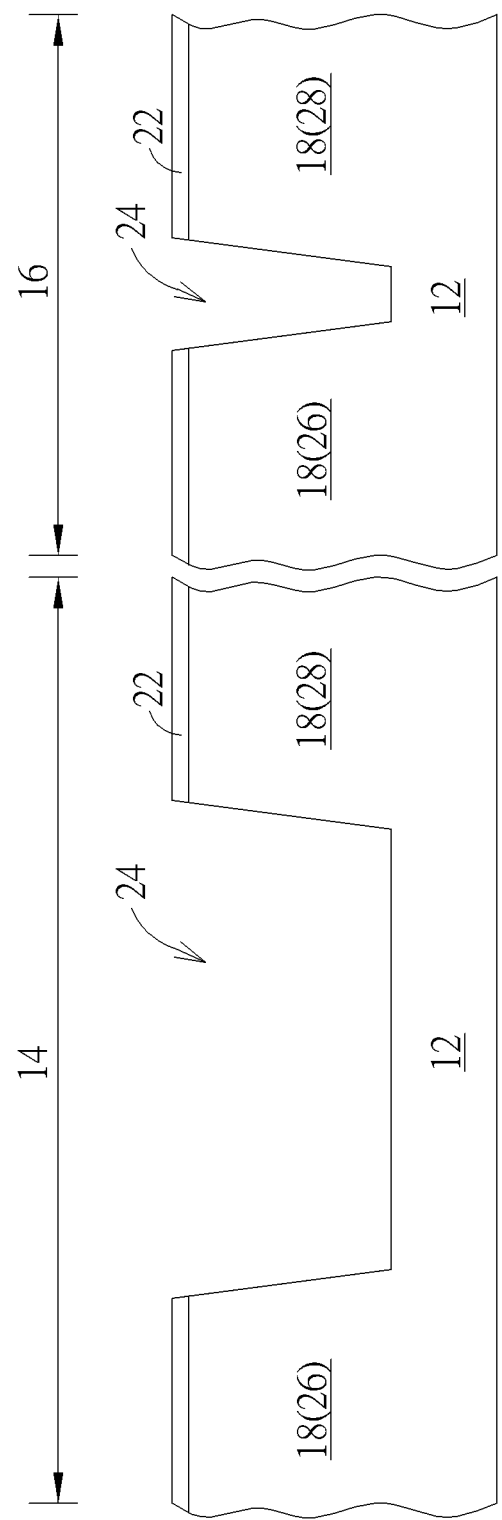
FIGS. 2-7 are cross-section views illustrating a method for fabricating a semiconductor device according to an embodiment of the present invention.

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, a first region such as a NMOS region 14 and a second region such as a PMOS region 16 are defined on the substrate 12, and at least a fin-shaped structure 18 is formed on each of the NMOS region 14 and PMOS region 16. It should be noted that even though four fin-shaped structures 18 are disposed on each of the transistor regions in this embodiment, it would also be desirable to adjust the number of fin-shaped structures 18 depending on the demand of the product, which is also within the scope of the present invention.

Preferably, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure are all within the scope of the present invention. It should be noted that after the fin-shaped structures 18 are formed, a liner 22 made of silicon oxide could be formed on the surface of the fin-shaped structures 18 on the NMOS region 14 and PMOS region 16.

Next, a shallow trench isolation (STI) 20 is formed around the fin-shaped structures 18. In this embodiment, the formation of the STI 20 could be accomplished by conducting a flowable chemical vapor deposition (FCVD) process to form a silicon oxide layer on the substrate 12 and covering the fin-shaped structures 18 entirely. Next, a chemical mechanical polishing (CMP) process along with an etching process are conducted to remove part of the silicon oxide layer so that the top surface of the remaining silicon oxide is slightly lower than the top surface of the fin-shaped structures 18 for forming the STI 20.

Next, as shown in FIG. 2, an etching process is conducted by using a patterned mask (not shown) as mask to remove part of the liner 22 and part of the fin-shaped structures 18 to form trenches 24, in which each of the trenches 24 preferably divides each of the fin-shaped structures 18 disposed on the NMOS region 14 and PMOS region 16 into two portions, including a portion 26 on the left side of the trench 24 and a portion 28 on the right side of the trench 24. In this embodiment, the width of the trench 24 on the NMOS region 14 is preferably greater than the width of the trench 24 on the PMOS region 16. Nevertheless, according to other embodiment of the present invention, it would also be desirable to adjust the width of the trenches 24 on both NMOS region 14 and PMOS region 16 so that the trenches 24 on both region 14, 16 could have same widths or different widths, which are all within the scope of the present invention.

Figure 3:
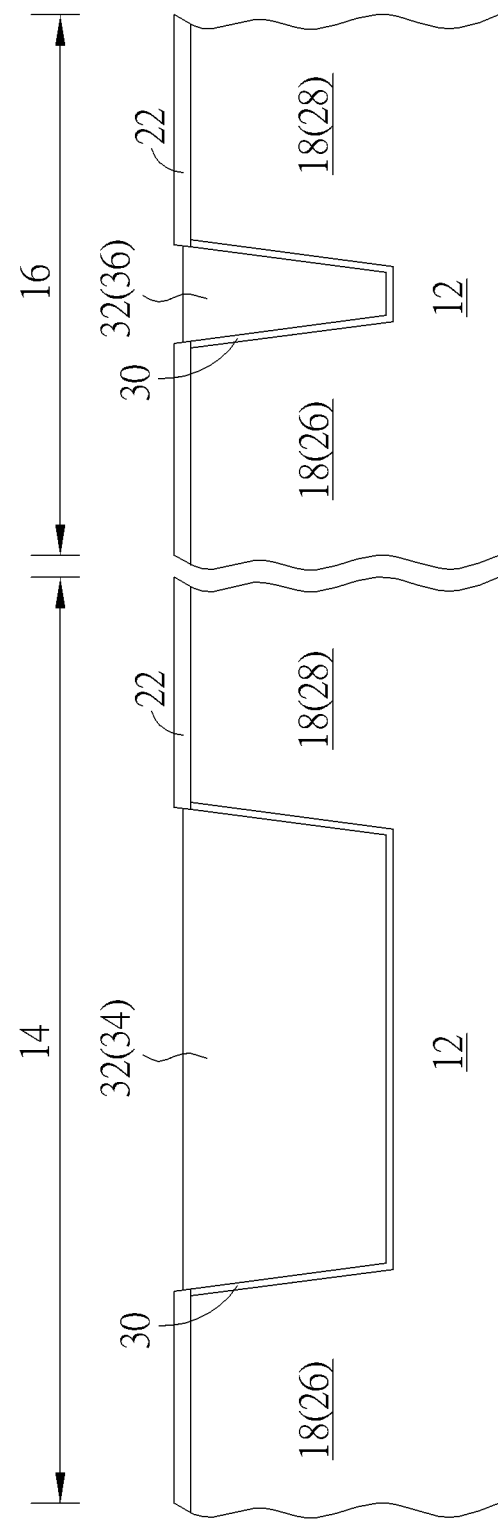

Next, as shown in FIG. 3, an oxidation process is conducted to form another liner 30 made of silicon oxide in the trenches 24 on the NMOS region 14 and PMOS region 16, in which the liner 30 is disposed on the bottom surface and two sidewalls of the trenches 24 and contacting the liner 22 directly. Next, a dielectric layer 32 is formed in the trenches 24 and filling the trenches 24 completely, and a planarizing process such as chemical mechanical polishing (CMP) process and/or etching process is conducted to remove part of the dielectric layer 32 so that the top surface of the remaining dielectric layer 32 is even with or slightly higher than the top surface of the fin-shaped structures 18. This forms a double diffusion break (DDB) structure 34 on the NMOS region 14 and a SDB structure 34 on the PMOS region 16 at the same time.

Preferably, two gate structures will be formed on the DDB structure 34 in the later process whereas only a single gate structure will be formed on the SDB structure 36. As shown in FIG. 1, each of the fin-shaped structures 18 on the NMOS region 14 and PMOS region 16 are disposed extending along a first direction (such as X-direction) while the DDB structure 34 and the SDB structure 36 are disposed extending along a second direction (such as Y-direction), in which the first direction is orthogonal to the second direction.

It should be noted that the dielectric layer 32 and the liner 30 in this embodiment are preferably made of different materials, in which the liner 30 is preferably made of silicon oxide and the dielectric layer 32 is made of silicon oxycarbonitride (SiOCN). Specifically, the DDB structure 34 and the SDB structure 36 made of SiOCN in this embodiment are preferably structures having low stress, in which the concentration proportion of oxygen within SiOCN is preferably between 30% to 60% and the stress of each of the DDB structure 34 and the SDB structure 36 is between 100 MPa to −500 MPa or most preferably at around 0 MPa. In contrast to the conventional DDB or SDB structures made of dielectric material such as silicon oxide or silicon nitride, the SDB structures of this embodiment made of low stress material such as SiOCN could increase the performance of on/off current in each of the transistors thereby boost the performance of the device.

Figure 4:
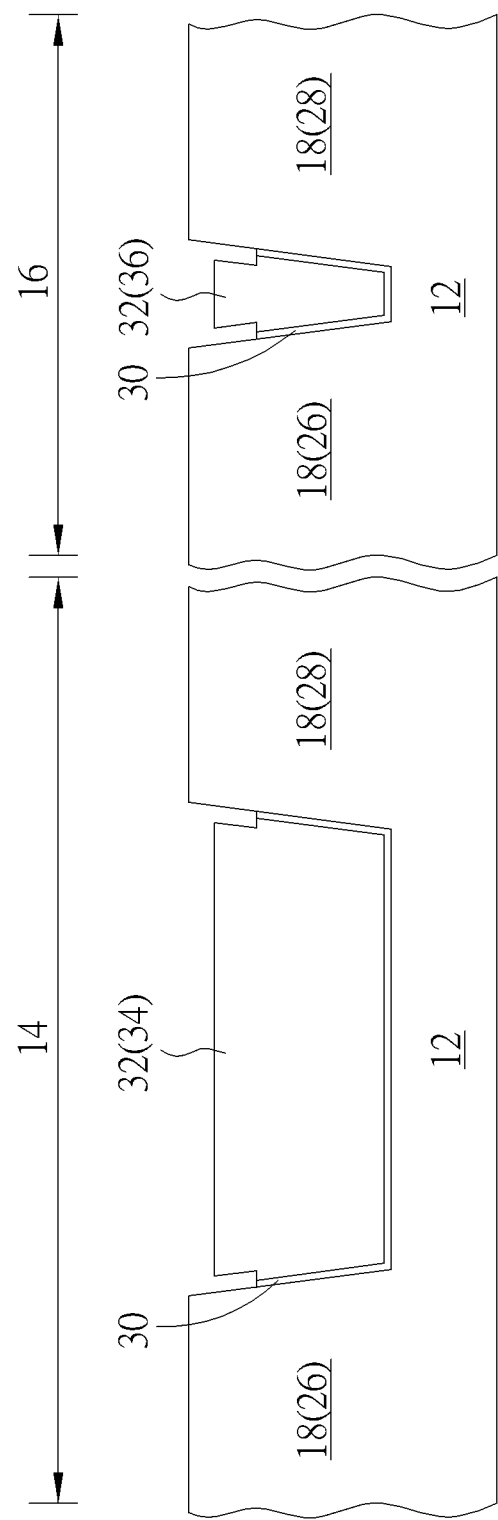

Next, as shown in FIG. 4, an ion implantation process could be conducted to form deep wells or well regions in the fin-shaped structures 18 on the NMOS region 14 and PMOS region 16, and a clean process could be conducted by using diluted hydrofluoric acid (dHF) to remove the liner 22 on the surface of the fin-shaped structures 18 completely, part of the liner 30 on sidewalls of the trenches 24, and even part of the DDB structure 34 and the SDB structure 36. This exposes the surface of the fin-shaped structures 18 and the top surfaces of the remaining liner 30, the DDB structure 34, and the SDB structure 36 are slightly lower than the top surface of the fin-shaped structures 18 while the top surface of the DDB structure 34 and the SDB structure 36 is also slightly higher than the top surface of the remaining liner 30.

Figure 5:
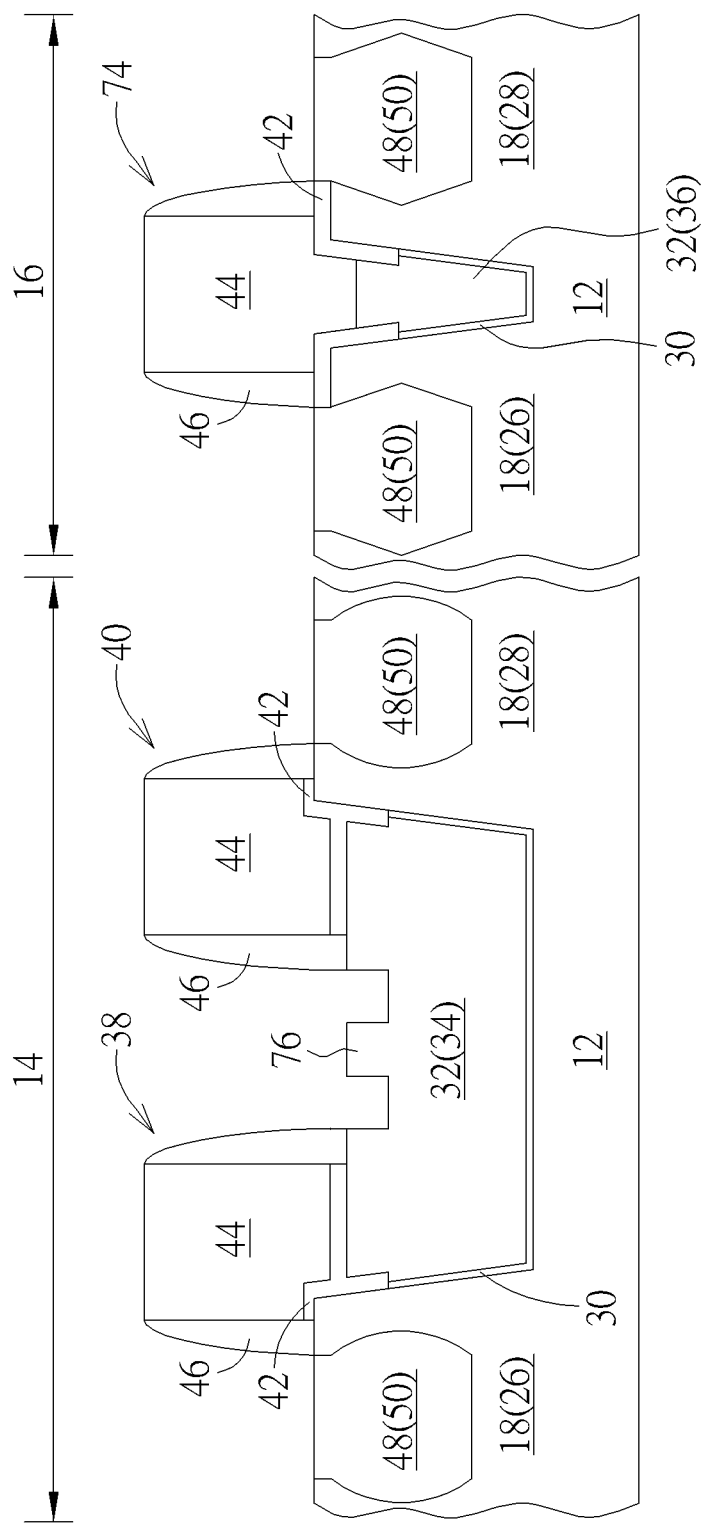

Next, as shown in FIG. 5, at least a gate structure such as gate structures 38, 40, 74 or dummy gates are formed on the fin-shaped structures 18 on the NMOS region 14 and PMOS region 16. In this embodiment, the formation of the first gate structure 38, 40, 74 could be accomplished by a gate first process, a high-k first approach from gate last process, or a high-k last approach from gate last process. Since this embodiment pertains to a high-k last approach, a gate dielectric layer 42 or interfacial layer, a gate material layer 44 made of polysilicon, and a selective hard mask could be formed sequentially on the substrate 12 or fin-shaped structures 18, and a photo-etching process is then conducted by using a patterned resist (not shown) as mask to remove part of the gate material layer 44 and part of the gate dielectric layer 42 through single or multiple etching processes. After stripping the patterned resist, gate structures 38, 40, 74 each composed of a patterned gate dielectric layer 42 and a patterned material layer 44 are formed on the fin-shaped structures 18.

It should be noted that the formation of the gate structures 38, 40, 74 by patterning the gate material layer 44 could be accomplished by a sidewall image transfer (SIT) process. For instance, a plurality of patterned sacrificial layers or mandrels having same widths and same distance therebetween could be formed on the gate material layer 44 and then deposition and etching process could be conducted to form spacers on sidewalls of the patterned sacrificial layers. After removing the patterned sacrificial layers, the pattern of the spacers is then transferred to the gate material layer 44 for forming gate structures 38, 40, 74. In this embodiment, two gate structures 38, 40 are formed on the DDB structure 34 on NMOS region 16 while only a single gate structure 74 is formed on the SDB structure 36 on PMOS region 14, in which the width of each of the gate structures 38, 40 on the NMOS region 16 is substantially equal to the width of the gate structure 74 on the PMOS region 14. Nevertheless, according to other embodiment of the present invention, it would also be desirable to adjust the size including widths of the gate structures 38, 40, 74 during the formation of the gate structures 38, 40, 74 so that the width of each of the gate structures 38, 40 on the NMOS region 14 could be less than or greater than the width of the gate structure 74 on the PMOS region 16, which are all within the scope of the present invention.

Next, at least a spacer 46 is formed on sidewalls of the each of the gate structures 38, 40, 74, a source/drain region 48 and/or epitaxial layer 50 is formed in the fin-shaped structure 18 adjacent to two sides of the spacer 46, and selective silicide layers (not shown) could be formed on the surface of the source/drain regions 48. In this embodiment, each of the spacers 46 could be a single spacer or a composite spacer, such as a composite spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 48 and epitaxial layers 50 could include different dopants and/or different materials depending on the conductive type of the device being fabricated. For instance, the source/drain region 48 on the NMOS region 14 could include n-type dopants and the epitaxial layer 50 on the same region could include silicon phosphide (SiP) while the source/drain region 48 on the PMOS region 16 could include p-type dopants and the epitaxial layer 50 on the same region could include silicon germanium (SiGe). It should be noted that since the spacers 46 and the DDB structure 34 on the NMOS region 14 could be made of same material including but not limited to for example silicon oxide or silicon nitride, part of the DDB structure 34 could be removed to form at least a protrusion 76 between the two gate structures 38, 40 when deposition and etching back processes were conducted to form the spacers 46.

Figure 6:
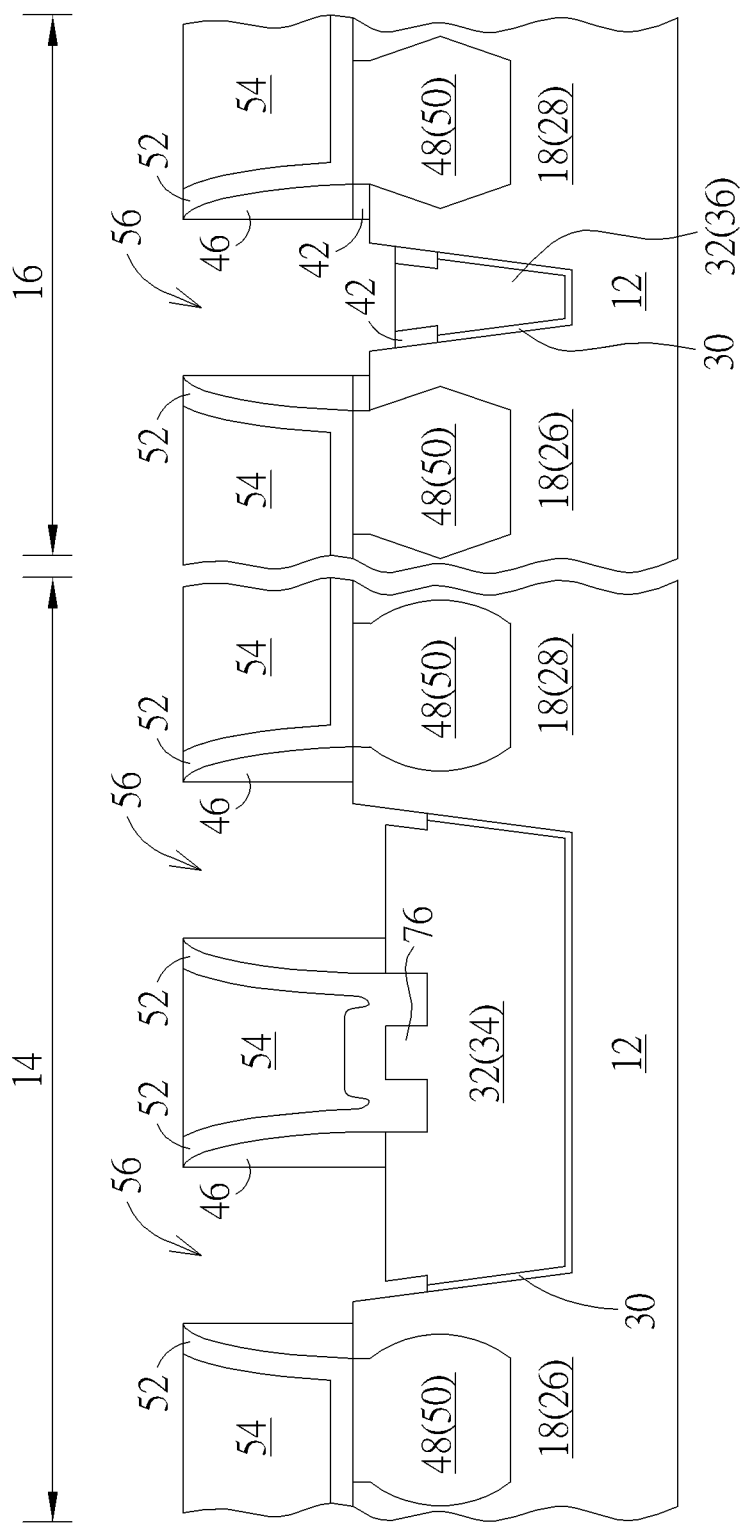

Next, as shown in FIG. 6, a contact etch stop layer (CESL) 52 is formed on the surface of the fin-shaped structures 18 and covering the gate structures 38, 40, 74, and an interlayer dielectric (ILD) layer 54 is formed on the CESL 52. Next, a planarizing process such as CMP is conducted to remove part of the ILD layer 54 and part of the CESL 52 for exposing the gate material layer 44 made of polysilicon, in which the top surface of the gate material layer 44 is even with the top surface of the ILD layer 54.

Next, a replacement metal gate (RMG) process is conducted to transform the gate structures 38, 40, 74 into metal gates 60. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from the gate structures 38, 40, 74 for forming recesses 56 in the ILD layer 54.

Figure 7:
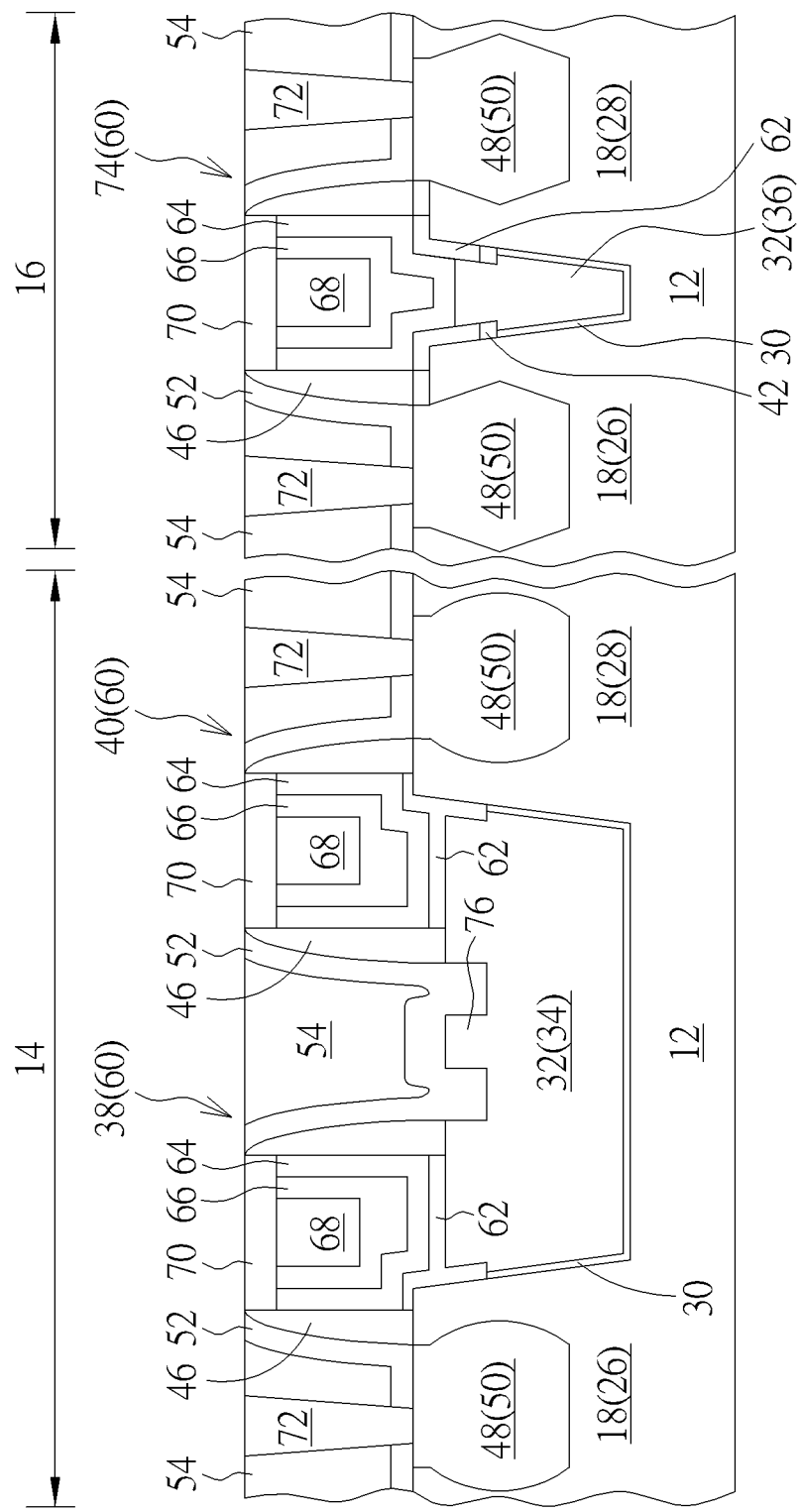

Next, as shown in FIG. 7, a selective interfacial layer or gate dielectric layer 62, a high-k dielectric layer 64, a work function metal layer 66, and a low resistance metal layer 68 are formed in the recesses 56, and a planarizing process such as CMP is conducted to remove part of low resistance metal layer 68, part of work function metal layer 66, and part of high-k dielectric layer 64 to form metal gates 60. Next, part of the low resistance metal layer 68, part of the work function metal layer 66, and part of the high-k dielectric layer 64 are removed to form a recess (not shown) on each of the transistor region, and a hard mask 70 made of dielectric material including but not limited to for example silicon nitride is deposited into the recesses so that the top surfaces of the hard mask 70 and ILD layer 54 are coplanar. In this embodiment, each of the gate structures or metal gates 60 fabricated through high-k last process of a gate last process preferably includes an interfacial layer or gate dielectric layer 62, a U-shaped high-k dielectric layer 64, a U-shaped work function metal layer 66, and a low resistance metal layer 68.

In this embodiment, the high-k dielectric layer 64 is preferably selected from dielectric materials having dielectric constant (k value) larger than 4. For instance, the high-k dielectric layer 64 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 66 is formed for tuning the work function of the metal gate in accordance with the conductivity of the device. For an NMOS transistor, the work function metal layer 66 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 66 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 66 and the low resistance metal layer 68, in which the material of the barrier layer may include titanium (Ti), titanium nitride (TiN), tantalum (Ta) or tantalum nitride (TaN). Furthermore, the material of the low-resistance metal layer 68 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 54 and part of the CESL 52 for forming contact holes (not shown) exposing the source/drain regions 48 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 72 electrically connecting the source/drain regions 48. This completes the fabrication of a semiconductor device according to a preferred embodiment of the present invention.

It should be noted that even though a SIT scheme is employed to form the gate structures 38, 40, 74 on NMOS region 14 and PMOS region 16 respectively, according to other embodiment of the present invention, it would also be desirable to first form gate structures and spacers having equal widths on NMOS region 14 and PMOS region 16 at the same time, remove the gate structure made of polysilicon on the NMOS region 14 so that the remaining spacer could be used as a sacrificial gate structure, and then form new spacer on sidewalls of the sacrificial gate structure on the NMOS region 14. Next, RMG process conducted from FIGS. 6-7 could be carried out to transform the sacrificial or dummy gate structure originally made from spacer on NMOS region 14 and the gate structure made from polysilicon on PMOS region 16 to metal gates. In this approach, since the metal gate on the NMOS region 14 is transformed from spacer, the width of the final metal gate formed on NMOS region 14 would be equal to the width of the spacer on each sidewall of the gate structure 74 on PMOS region 16.

Referring to FIG. 7, FIG. 7 further illustrates a structural view of a semiconductor device according to an embodiment of the present invention. As shown in FIG. 7, the semiconductor device includes a DDB structure 34 disposed on the NMOS region 14 for dividing the fin-shaped structure 18 on the NMOS region 14 into two portions including portions 26 and 28 adjacent to two sides of the DDB structure 34, gate structures 38 and 40 disposed on the DDB structure 34, a SDB structure 36 disposed on the PMOS region 16 for dividing the fin-shaped structure 18 on the PMOS region 16 into two portions including portions 26 and 28 adjacent to two sides of the SDB structure 36, and a single gate structure 74 disposed on the SDB structure 36.

In this embodiment, the two gate structures 38, 40 disposed on the DDB structure 34 preferably overlap the fin-shaped structure 18 and the DDB structure 34 at the same time. For instance, the left gate structure 38 is disposed to overlap or stand on the fin-shaped structure 18 on the left and part of the DDB structure 34 at the same time while the right gate structure 40 is disposed to overlap the fin-shaped structure 18 on the right and part of the DDB structure 34 at the same time. Preferably, the bottom surfaces of the gate structures 38, 40 disposed directly on the DDB structure 34 are slightly lower than the top surface of the fin-shaped structure 18 on two adjacent sides. Specifically, the DDB structure 34 also includes a protrusion 76 protruding from the top surface of the DDB structure 34 and between the two gate structures 38, 40, in which the top surface of the protrusion 76 could be slightly lower than, even with, or higher than the top surface of the fin-shaped structure 18.

Only a single gate structure 74 however is disposed on top of the SDB structure 36 on the PMOS region 16, in which the bottom surface of the gate structure 74 is preferably lower than the top surface of the fin-shaped structure 18 on two adjacent sides as the gate structure 74 is standing on the fin-shaped structure 18 and the SDB structure 36 at the same time. Preferably, the width of each of the gate structures 38, 40 on the DDB structure 34 could be less than, equal to, or greater than the width of the gate structure 74 disposed on the SDB structure 36, the width of either bottom surface or top surface of the DDB structure 34 could be less than, equal to, or greater than the width of bottom surface or top surface of the SDB structure 36, and the top surface of the DDB structure 34 excluding the protrusion 76 could be lower than, even with, or higher than the top surface of the SDB structure 36, which are all within the scope of the present invention.

Overall, the present invention provides an approach for integrating DDB structure and SDB structure for accommodating tensile stress applied on NMOS devices and compressive stress applied on PMOS devices, in which a DDB structure is formed on the NMOS region while a SDB structure is formed on the PMOS region. Structurally, the top surface of both the DDB structure and SDB structure is slightly lower than the top surface of fin-shaped structures on two adjacent sides, two gate structures are disposed on the DDB structure and fin-shaped structures on two adjacent sides at the same time, a protrusion is formed on the top surface of the DDB structure and between the two gate structures, and only a single gate structure is disposed on the SDB structure and fin-shaped structures on two adjacent sides.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first fin-shaped structure on the first region;
   removing part of the first fin-shaped structure to form a first trench;
   forming a dielectric layer in the first trench to form a double diffusion break (DDB) structure; and
   forming a first gate structure and a second gate structure on the DDB structure, wherein a bottom surface of the first gate structure is lower than a top surface of the first fin-shaped structure.

2. The method of claim 1, further comprising:
   forming the first fin-shaped structure on the first region and a second fin-shaped structure on the second region;
   removing part of the first fin-shaped structure and part of the second fin-shaped structure to form the first trench and a second trench;
   forming the DDB structure in the first trench and a single diffusion break (SDB) structure in the second trench;
   forming the first gate structure and the second gate structure on the DDB structure and a third gate structure on the SDB structure.

3. The method of claim 2, wherein a bottom surface of the third gate structure is lower than a top surface of the second fin-shaped structure.

4. The method of claim 2, further comprising:
   forming a first source/drain region adjacent to the first gate structure and the second gate structure and a second source/drain region adjacent to the third gate structure; and
   performing a replacement metal gate (RMG) process to transform the first gate structure, the second gate structure, and the third gate structure into a first metal gate, a second metal gate, and a third metal gate.

5. The method of claim 2, wherein the step of forming the first gate structure and the second gate structure comprises:
   forming a gate material layer on the DDB structure; and
   patterning the gate material layer to form the first gate structure, the second gate structure, and the third gate structure.

6. The method of claim 5, further comprising performing a sidewall image transfer (SIT) process for patterning the gate material layer.

7. The method of claim 1, wherein the first gate structure overlaps the first fin-shaped structure and the DDB structure.

8. The method of claim 1, wherein the second gate structure overlaps the first fin-shaped structure and the DDB structure.

9. The method of claim 2, wherein a width of the first gate structure is equal to a width of the third gate structure.

10. The method of claim 1, wherein a width of the first gate structure is equal to a width of the second gate structure.

11. The method of claim 1, wherein the first region comprises a NMOS region and the second region comprises a PMOS region.

12. A semiconductor device, comprising:
    a substrate having a first region and a second region;
    a first fin-shaped structure on the first region;
    a double diffusion break (DDB) structure in the first fin-shaped structure to divide the first fin-shaped structure into a first portion and a second portion; and a first gate structure and a second gate structure on the DDB structure, wherein a bottom surface of the first gate structure is lower than a top surface of the first fin-shaped structure.

13. The semiconductor device of claim 12, wherein the first gate structure overlaps the first portion and the DDB structure.

14. The semiconductor device of claim 12, wherein the second gate structure overlaps the second portion and the DDB structure.

15. The semiconductor device of claim 12, further comprising:
- a second fin-shaped structure on the second region;
- a single diffusion break (SDB) structure in the second fin-shaped structure to divide the second fin-shaped structure into a third portion and a fourth portion; and
- a third gate structure on the SDB structure.

16. The semiconductor device of claim 15, wherein a bottom surface of the third gate structure is lower than a top surface of the second fin-shaped structure.

17. The semiconductor device of claim 15, wherein the third gate structure overlaps the third portion, the fourth portion, and the SDB structure.

18. The semiconductor device of claim 15, wherein a width of the first gate structure is equal to a width of the third gate structure.

19. The semiconductor device of claim 12, wherein a width of the first gate structure is equal to a width of the second gate structure.

20. The semiconductor device of claim 12, wherein the first region comprises a NMOS region and the second region comprises a PMOS region.

\* \* \* \* \*